United States Patent [19]

Akutsu et al.

[11] Patent Number: 5,452,174
[45] Date of Patent: Sep. 19, 1995

[54] POWER SOURCE CIRCUIT INCORPORATING A PROTECTION DEVICE THEREIN AND A PRINTER DEVICE EMPLOYING THE SAME

[75] Inventors: Naoji Akutsu; Yasuhiro Shirai; Akira Hagiwara, all of Tokyo, Japan

[73] Assignee: Oki Electric Industry Co., Ltd., Tokyo, Japan

[21] Appl. No.: 261,903

[22] Filed: Jun. 15, 1994

[30] Foreign Application Priority Data

Jun. 25, 1993 [JP] Japan .................................. 5-155185

[51] Int. Cl.$^6$ ............................................. H02H 3/08
[52] U.S. Cl. ......................................... 361/94; 361/97
[58] Field of Search ....................... 361/18, 94, 96, 97; 363/50, 52

[56] References Cited

U.S. PATENT DOCUMENTS 4,943,766  7/1990  Suzuki .................................. 361/94
5,113,304  5/1992  Ozaki et al. ............................ 361/97

FOREIGN PATENT DOCUMENTS 20245819  11/1987  European Pat. Off. .

*Primary Examiner*—Todd Deboer
*Attorney, Agent, or Firm*—Steven M. Rabin

[57] ABSTRACT

A power source circuit is provided having a high frequency transformer 16, a switching control circuit 15 connected with the primary winding of the transformer 16, rectifier circuits 17, 18 and 20 connected with the secondary winding of the transformer 16 for outputting a D.C. voltage to an external circuit, an alarm detection circuit 25, an excess current detection circuit 26, and an excess current detection delay circuit 28. When the alarm detection circuit 25 detects an excess current in supplying power source, the power source supply is suspended by turning off the output of the switching control circuit 15 after the lapse of the preset time. When the excess current flows after the lapse of the initial preset time $t_s$ from turning on the power source, the excess current detection circuit 26 detects it so that the output of the switching control circuit 15 is turned off.

16 Claims, 8 Drawing Sheets

POWER SOURCE CIRCUIT INCORPORATING A PROTECTION DEVICE THEREIN AND A PRINTER DEVICE EMPLOYING THE SAME

REFERENCE TO RELATED APPLICATION

This application claims the priority right under 35 U.S.C. 119, of Japanese Patent Application No. Hei 05-155185 filed on Jun. 25, 1993, the entire disclosure of which is incorporated herein by reference.

BACKGROUND OF THE INVENTION

1. Field of the Invention

The present invention relates to a power source circuit incorporating a protection device therein, more particularly, to a power source circuit effectively applied to a printer device such as a wire dot printer or the like.

2. Description of Related Arts

A conventional power source circuit utilized in a printer or the like rectifies an alternate current (A.C.) from an A.C. power source into a direct current (D.C.), generates a high frequency current signal by a switching control circuit, transforms the current signal by a transformer, rectifies it and outputs a D.C. voltage having various values.

In this case, there is provided an alarm circuit in the power source circuit which detects an occurrence of various abnormal operations when a printer is activated, and when the abnormal operation occurs at an external circuit which is connected with the output terminal of the power source circuit, then the alarm circuit transmits an alarm signal to the switching control circuit to suspend the operation of the switching control circuit.

However, there arises a problem in the conventional power source circuit having such a protection function that when an user of the printer turns on a power source switch again just after turning it off after an alarm detection circuit detects an excess current and turns off the switching control circuit, the excess current again flows so as to cause high power source being applied to the external circuit. If an attempt is made to have the alarm detection circuit detect the excess current, the alarm detection circuit requires a long period of time until it detects the high power source being applied to the external circuit because the alarm detection circuit is designed by considering the current and the duration time of the current under a normal operation of the printer.

FIG. 7 is a time chart of current when the printer is operated; and FIG. 8 is a time chart of current when the power source switch of the printer is turned on.

As shown in FIG. 7, under the normal operation of the printer, the current $I_1$ flows during the time $\Delta t_1$ necessary to print for one line and the current less than $I_1$ flows during time necessary for a line feed.

Also as shown in FIG. 8, when the power source switch of the printer is turned on, a capacitor in the external circuit provides the rush current $I_2$ during the time $\Delta t_2$. Since the alarm detection circuit is designed by considering the current $I_1$, the time $\Delta t_1$ during which the current $I_1$ flows, the rush current $I_2$, and the time $\Delta t_2$ during which the rush current $I_2$ flows, a preset time $t_s$ with which the alarm detection circuit detects the excess current has been set with a long period of time. Accordingly, it takes, for example, approximately four seconds from turning off the switching control circuit to suspending the supply of the power source voltage to the external circuit. Therefore, there arises a problem that the high power source application to the external circuit due to the flow of the excess current may magnify damages of the output circuit.

SUMMARY OF THE INVENTION

It is an object of the present invention to provide a power source circuit incorporating a protection device therein which can prevent magnification of damages in the external circuit even if an user turns on the power source switch again just after turning it off.

It is another object of the present invention to provide a printer device employing the above mentioned power source circuit.

To accomplish these objects, there is provided a power source circuit incorporating a protection device therein having: a high frequency transformer having a primary and a secondary windings for transforming a current signal at the primary winding and outputting a current signal from the secondary winding having a preset voltage; a switching control circuit connected with the primary winding of the high frequency transformer for generating a high frequency current signal; a rectifier circuit connected with the secondary winding of the high frequency transformer for rectifying a current signal into a D.C. current and supplying power source to an external circuit; an alarm detection circuit for detecting abnormal operations including an excess current in supplying power source from the rectifier circuit, turning off an output of the switching control circuit if the excess current exceeds a predetermined preset time, and suspending power source supply to the external circuit; and an excess current detection circuit for detecting the excess current after turning on a power source switch, turning off the output of the switching control circuit if the excess current is detected after a lapse of an initial preset time which is shorter than the preset time, and suspending the power source supply to the external circuit.

According to another aspect of the present invention, there is provided a power source circuit incorporating a protection device therein having: a high frequency transformer having a primary and a secondary windings for transforming a current signal at the primary winding and outputting a current signal from the secondary winding having a preset voltage; a switching control circuit connected with the primary winding of the high frequency transformer for generating a high frequency current signal; a rectifier circuit connected with the secondary winding of the high frequency transformer for rectifying a current signal into a D.C. current and supplying power source to an external circuit; an alarm detection circuit for detecting abnormal operations including an excess current in supplying power source from the rectifier circuit; an excess current detection circuit for detecting the excess current after turning on a power source switch; and a time count circuit for measuring a first duration of time of a detection signal input from the alarm detection circuit and judging as to whether the first duration of time exceeds a predetermined preset time or not, and for measuring a second duration of time of a detection signal input from the excess current detection circuit and judging as to whether the second duration of time exceeds a predetermined initial preset time which is shorter than the preset time or not, so that the switching control circuit is turned off when both judgements are affirmative.

According to further aspect of the present invention, there is provided a printer device having a power source circuit incorporating a protection device therein, the power source circuit having: a high frequency transformer having a primary and a secondary windings for transforming a current signal at the primary winding and outputting a current signal from the secondary winding having a preset voltage; a switching control circuit connected with the primary winding of the high frequency transformer for generating a high frequency current signal; a rectifier circuit connected with the secondary winding of the high frequency transformer for rectifying a current signal into a D.C. current and supplying power source to an external circuit; an alarm detection circuit for detecting abnormal operations including an excess current in supplying power source from the rectifier circuit, turning off an output of the switching control circuit if the excess current exceeds a predetermined preset time, and suspending power source supply to the external circuit; and an excess current detection circuit for detecting the excess current after turning on a power source switch, turning off the output of the switching control circuit if the excess current is detected after a lapse of an initial preset time which is shorter than the preset time, and suspending the power source supply to the external circuit.

According to still another aspect of the present invention, there is provided a printer device having a power source circuit incorporating a protection device therein, the power source circuit having: a high frequency transformer having a primary and a secondary windings for transforming a current signal at the primary winding and outputting a current signal from the secondary winding having a preset voltage; a switching control circuit connected with the primary winding of the high frequency transformer for generating a high frequency current signal; a rectifier circuit connected with the secondary winding of the high frequency transformer for rectifying a current signal into a D.C. current and supplying power source to an external circuit; an alarm detection circuit for detecting abnormal operations including an excess current in supplying power source from the rectifier circuit; an excess current detection circuit for detecting the excess current after turning on a power source switch; and a time count circuit for measuring a first duration of time of a detection signal input from the alarm detection circuit and judging as to whether the first duration of time exceeds a predetermined preset time or not, and for measuring a second duration of time of a detection signal input from the excess current detection circuit and judging as to whether the second duration of time exceeds a predetermined initial preset time which is shorter than the preset time or not, so that the switching control circuit is turned off when both judgements are affirmative.

According to the present invention, when the power source switch is turned on, the switching control circuit generates a high frequency current signal and inputs it to the primary winding of the high frequency transformer, whereby the current signal having a predetermined voltage is output from the secondary winding of the high frequency transformer, rectified by the rectifier circuit and applied to the output circuit.

The excess current detection circuit turns off the switching control circuit by outputting the detection signal to the switching control circuit when the preset time has elapsed after detecting the excess current. On this moment, the excess current detection delay circuit delays a detection of the excess current until the lapse of the initial preset time, which is shorter than the preset time, after turning on the power source switch.

Turning off the switching control circuit in response to the detection of the excess current, if an user of the device again turns on the power source switch just after turning it off, the excess current detection circuit detects the excess current when the initial preset time, which is shorter than the preset time, is elapsed and turns off the switching control circuit by outputting the detection signal to the switching control circuit.

According to the another aspect of the present invention, when the power source switch is turned on, the switching control circuit generates a high frequency current signal and inputs it into the primary winding of the high frequency transformer. Therefore, the current signal having a preset voltage is output from the secondary winding of the high frequency transformer, rectified by the rectifier circuit, and applied to the external circuit.

Further, the excess current detection circuit turns off the switching control circuit by outputting the detection signal to the switching control circuit when the preset time has elapsed after the detection of the excess current. On this instance, the time count circuit suspends the detection signal after turning on the power source switch until the lapse of the initial preset time which is shorter than the preset time.

Then, turning off the switching control circuit in response to the detection of the excess current, when an user of the device again turns on the power source switch just after turning it off, the time count circuit outputs the detection signal to the switching control circuit when the initial preset time which is shorter than the preset time has elapsed, and turns off the switching control circuit.

BRIEF DESCRIPTION OF DRAWINGS

FIG. 8 is a time chart of current when a power source switch is turned on;

DETAILED DESCRIPTION OF THE PREFERRED EMBODIMENTS

Detailed description will be made as to the embodiment of the power source circuit incorporating a protection device therein according to the present invention with reference to attached drawings. Although the description is made as to the embodiment in which the present invention is applied to a printer device, the invention can also be applied to any electric apparatus which necessitates the similar power source circuit.

Figure 2:
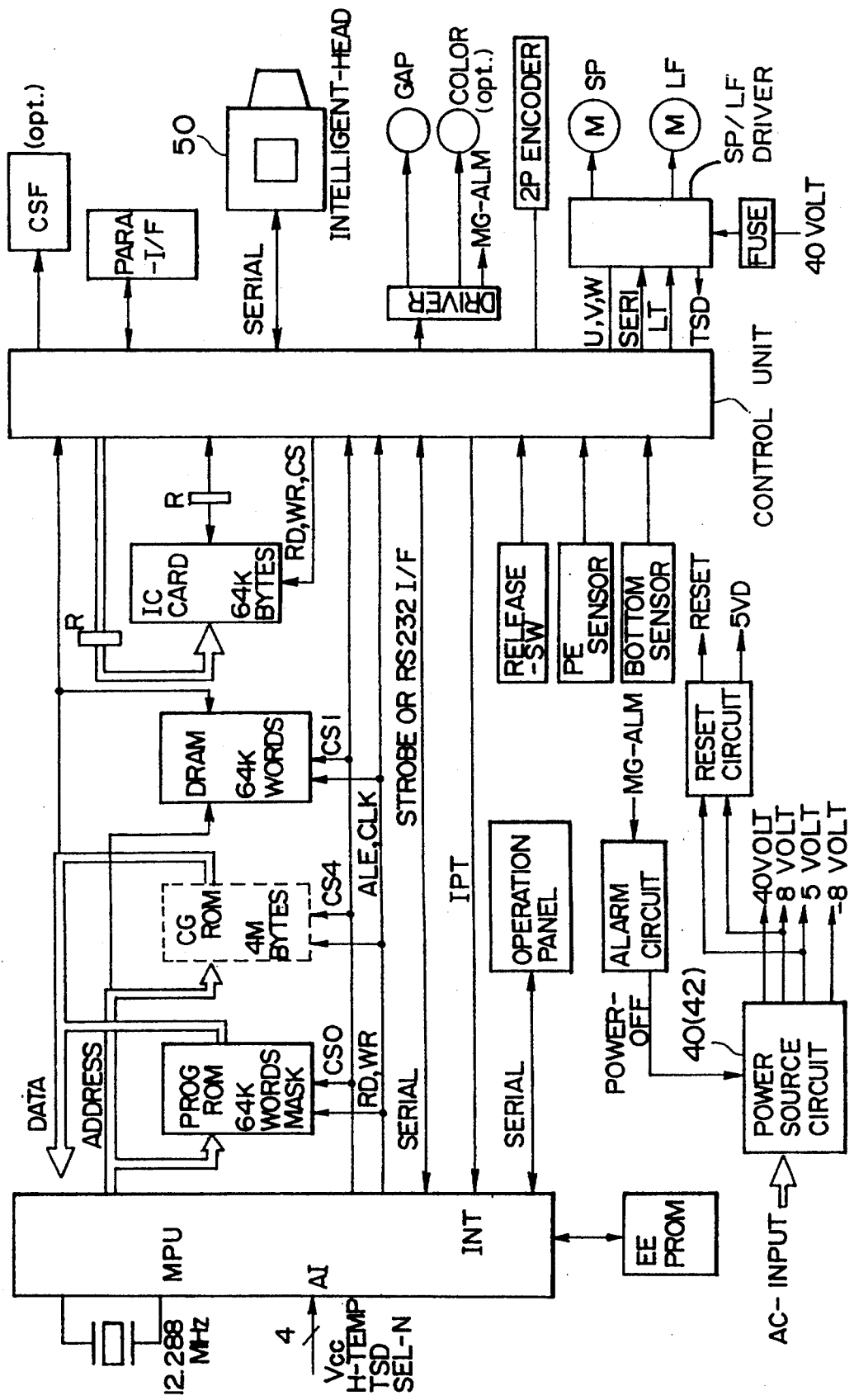
FIG. 2 is a functional block diagram of a printer device to which the power source circuit according to the present invention is applied.

FIG. 2 is a functional block diagram of a printer device to which a power source circuit incorporating a protection device therein according to the present invention is applied.

The printer device shown in FIG. 2 is a dot impact printer which performs printing with an intelligent print head 50. A power supply circuit 40 (42) incorporating a protection device therein is a power source circuit which supplies predetermined voltages to each of the components of the printer. In other words, the power supply circuit 40 (42) rectifies an alternate current (A.C.) from an A.C. power source into a direct current (D.C.) and generates a high frequency current signal with use of a switching control circuit. The current signal generated above is input to a high frequency transformer so as to be transformed, and then rectified, thereby supplying various D.C. voltages including 40[V], 8[V],5[V], and −8[V]. The power supply circuit 40(42) incorporates therein an alarm circuit which detects various abnormal operations in a power source system when the printer is activated. When the alarm circuit detects the abnormal operation, it transmits an alarm signal to the switching control circuit for suspending it, thereby preventing continuous flow of excess current through each of the components of the printer.

Figure 1:
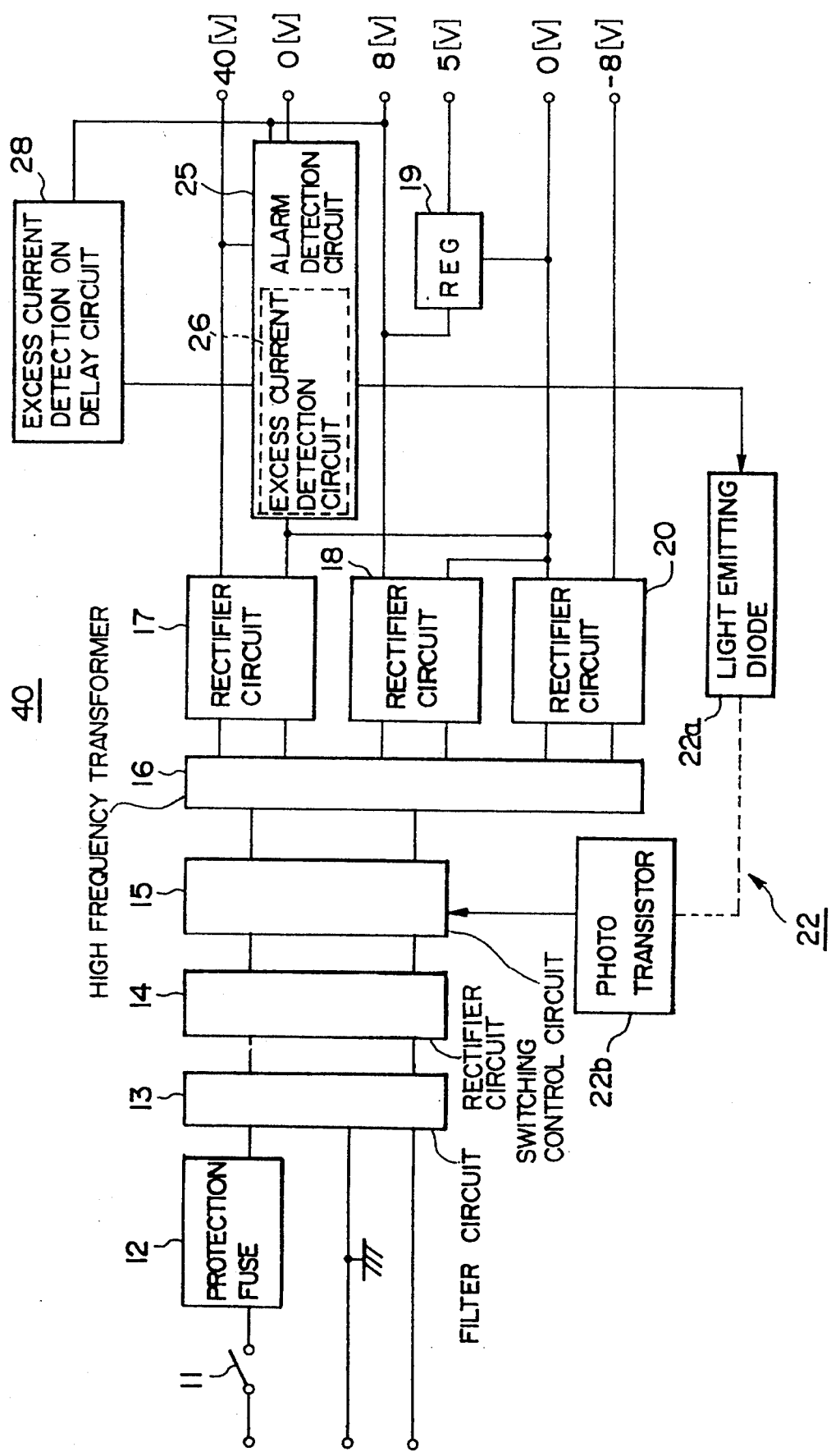
FIG. 1 is a block diagram illustrating the first embodiment of a power source circuit incorporating a protection device therein according to the present invention.

FIG. 1 is a block diagram illustrating the first embodiment of the power supply circuit 40 incorporating a protection device therein according to the present invention, wherein a numeral 11 denotes a power source switch for starting or stopping the operation of the printer; a numeral 12 a protection fuse; a numeral 13 a filter circuit which is constituted of unillustrated coils and capacitors; a numeral 14 a rectifier circuit which rectifies A.C. into D.C.; a numeral 15 a switching control circuit, which contains an unillustrated switching power source circuit, for controlling switching of the switching power source circuit; and a numeral 16 a high frequency transformer. When a high frequency current signal is applied to the primary winding of the high frequency transformer 16, current signals having various value voltages are output from the secondary winding.

A numeral 17 denotes a rectifier circuit for rectifying the current signal output through the secondary winding of the transformer 16 and outputting a D.C. voltage having 40[V]. A numeral 18 denotes a rectifier circuit for rectifying the current signal output through the secondary winding of the transformer 16 and outputting a D.C. voltage having 8[V]. A numeral 19 denotes a three terminal regulator for producing a D.C. voltage having 5[V] from a D.C. voltage having 8[V]. The three terminal regulator 19 can be replaced by a secondary chopper circuit. A numeral 20 denotes a rectifier circuit for rectifying the current signal output through the secondary winding of the high frequency transformer 16 and outputting −8[V] D.C. voltage. The D.C. voltages output through the rectifier circuits 17, 18 and 20 are applied, as power source voltages, to internal circuits of the printer (see FIG. 2) connected with the output terminals of the rectifier circuit 40.

A numeral 22 denotes a photo coupler constituted of a light emitting diode 22a and a photo transistor 22b. A numeral 25 denotes an alarm detection circuit for detecting various kinds of abnormal operations when the printer is activated, which detects an excess current or an excess voltage, or detects the alarm signal being output from the external circuit connected with the rectifier circuit 40. The alarm detection circuit 25 in the present embodiment contains an excess current detection circuit 26 which detects the excess current.

A numeral 28 denotes an excess current detection delay circuit which delays detection of the excess current by the excess current detection circuit 26 until the lapse of the initial preset time $t_a$ after turning on of the power source switch 11. The initial preset time $t_a$ in the present embodiment is set, for example, to be 200–300 [ms] which is longer than the time $\Delta t_2$ but shorter enough than the preset time $t_s$.

Next, description is made as to the operation of the protection device for the above structured power source circuit.

First, when the power source switch 11 is turned on, an alternate current (A.C.) supplied to the rectifier circuit 14 through the protection fuse 12 and the filter circuit 13 is rectified into a direct current (D.C.) by the rectifier circuit 14 and output to the switching control circuit 15. The switching control circuit 15 contains a switching power source circuit, switching of which is controlled so as to output a high frequency current signal to the primary winding of the high frequency transformer 16.

The transformer 16 outputs from the secondary winding the current signal having a preset voltage corresponding to the transformation ratio of the current signal voltage received at the primary winding. Consecutively, the rectifier circuit 17 outputs 40[V] D.C. voltage by rectifying the current signal output through the secondary winding of the transformer 16. The rectifier circuit 18 outputs 8[V] D.C. voltage by rectifying the current signal output through the second winding of the transformer 16. The three terminal regulator 19 outputs 5[V] D.C. voltage. The rectifier circuit 20 outputs −8[] D.C. voltage by rectifying the current signal output through the secondary winding of the high frequency transformer 16. These D.C. voltages are supplied as power source voltages to the circuit (hereinafter called as an external circuit) connected with the output terminals of the rectifier circuit 40. If the alarm detection circuit 25 detects the excess current or the excess voltage, or detects that an alarm signal is output from the external circuit, a detection signal is output through the photo coupler 22 to the switching control circuit 15, whereby the switching power source circuit is turned off and the power source voltage applied to the external circuit is suspended.

Therefore, the alarm detection circuit 25 measures the time during which the excess current flows when it, for example, detects the excess current. When the measured time exceeds the preset time $t_s$, judgement is made that the external circuit connected with the output terminals operates abnormally and the switching control circuit 15 is turned off.

On this moment, if an user of the printer again turns on the power source switch 11 just after turning it off, the excess current detection circuit 28 delays the detection of the excess current until the lapse of the initial preset time $t_a$. Then, after the elapse of the initial preset time $t_a$, the excess current detection circuit 26 judges as to whether the excess current is detected or not and outputs the result of judgement as the detection signal to the switching control circuit 15. In this case, if the 40[V] voltage, for example, does not rise, which is caused by excess current flow due to the abnormal operation of either the rectifier circuit 40 or the printer connected thereto, the output of the switching control circuit 15 is suspended until the lapse of the initial preset time $t_a$.

Figure 3:
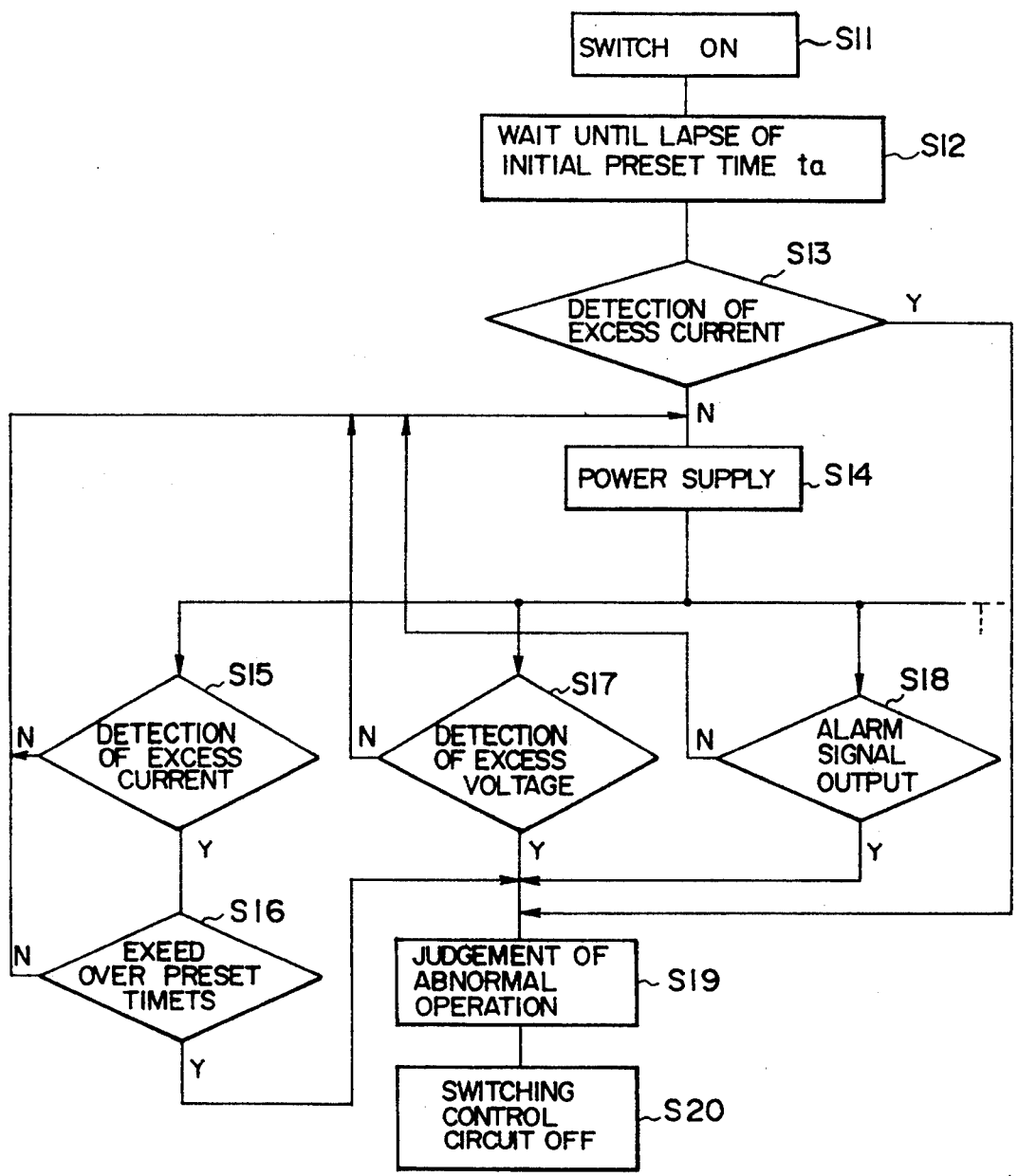
FIG. 3 is a flow chart illustrating operations of the power source circuit shown in FIG. 1.

Accordingly, even though the rush current $I_2$ may flow when the power source switch 11 is turned on again, the detection signal is never input to the switching control circuit 15 until the lapse of the initial preset time $t_a$. FIG. 3 is a flow chart illustrating operations of the first embodiment according to the present invention shown in FIG. 1, with which an alarm detection procedure is further explained hereunder.

Step S11: Turn on the power source switch 11.

Step S12: Wait until the lapse of the initial preset time $t_a$.

Step S13: Judge whether the excess current detection circuit 26 detects the excess current or not. When detected; then go to Step S19; otherwise go to Step S14.

Step S14: Supply power to the external circuit.

Step S15: Judge whether the alarm detection circuit 25 detects the excess current or not. When detected; go to Step S16; otherwise return to Step S14.

Step S16: Judge whether the time during which the excess current detection circuit 26 detects the excess current exceeds the preset time $t_s$ or not. When exceeded; go to Step S19; otherwise return to Step S14.

Step S17: Judge whether the alarm detection circuit 25 detects the excess voltage or not. When detected; go to Step S19; otherwise return to Step S14.

Step S18: Judge whether the alarm signal is output from the external circuit or not. When output; go to Step S19; otherwise return to Step S14.

Step S19: Judge that the external circuit is abnormally operated.

Step S20: Turn off the switching control circuit 15.

Figure 4:
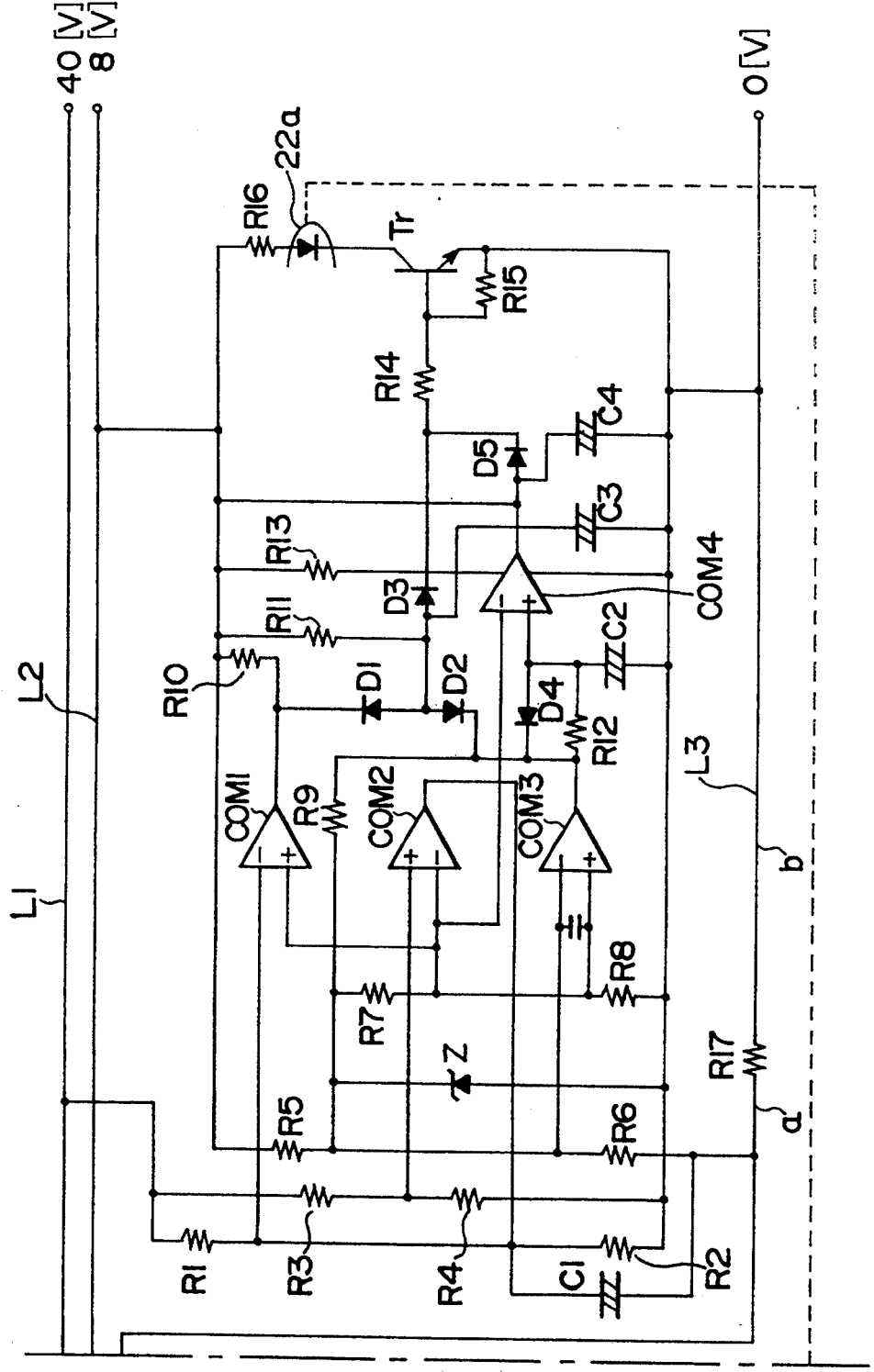
FIG. 4 is a circuit diagram illustrating a main portion of an embodiment of the power source circuit shown in FIG. 1.

FIG. 4 is a concrete circuit diagram illustrating a main portion of the first embodiment constituted of the alarm detection circuit 25, the excess current detection circuit 26, the excess current detection delay circuit 28, and the light emitting diode 22a. In the drawing, a reference L1 denotes a line which is connected to an unillustrated positive voltage terminal supplying 40[V] power source voltage; a reference L2 a line which is connected to the positive voltage terminal of the rectifier circuit 18 supplying 8[V] power source voltage; and a reference L3 a line which is connected to an unillustrated ground (GND) terminal of the rectifier circuits 17, 18 and 20. The excess current detection circuit 26 (see FIG. 1) and the excess current detection delay circuit 28 are formed between the lines L1–L3.

Further, COM1–COM4 denote comparators; R1–R17 resistors; C1–C4 capacitors; D1–D5 diodes; Z a Zener diode; Tr a transistor; and a numeral 22a a light emitting diode.

The resistors R1 and R2 divide the 40[V] power source voltage applied between the lines L1 and L3 and apply the detected voltage to the inverted input terminal of the comparator COM1. The resistors R3 and R4 divide the 40[V] power source voltage applied between the lines L1 and L3 and apply the detected voltage to the non-inverted input terminal of the comparator COM2 as its reference voltage. The resistors R5 and R6 divide the 8[V] power source voltage applied between the lines L2 and L3 and apply the detected voltage to the inverted input terminal of the comparator COM3. The resistors R7 and R8 divide the voltage across the resistors R5 and R6 and apply the detected voltage to the inverted input terminal and also apply it as a reference voltage to the non-inverted input terminal of the comparator COM3.

The resistor R17 serves to detect the excess current which may flow through the line L3. When the excess current flows through the resistor R17, a voltage is generated across the both terminals of the resistor R17 so that the potential of the position 6 which is connected to the external circuit (see FIG. 2) becomes higher than that of the position a which is connected to the GND terminals of the rectifier circuits 17, 18 and 20.

Figure 6:
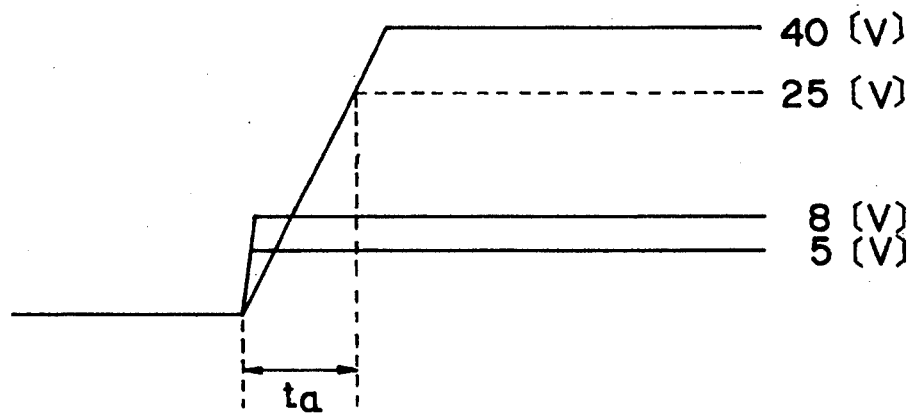
FIG. 6 is a time chart illustrating a power source voltage after a power source switch is turned on in the power source circuit shown in FIG. 1.
Figure 7:
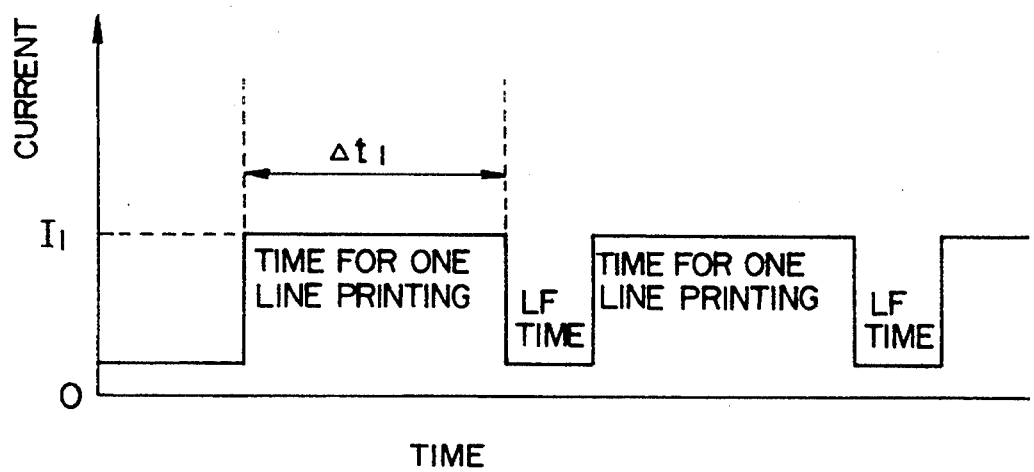
FIG. 7 is a time chart of current when a printer is operated.

When the power source switch 11 is turned on, the 40[V] power source voltage rises gently, as shown in FIG. 6, as compared to the 8[V] or 5[V] voltages so that the detection voltage of the comparator COM2 reveals higher than the reference voltage during the initial preset time $t_a$ during which the power source voltage reveals 0–25[V], thereby the output of the comparator COM2 staying a low level. Similarly, the detection voltage of the comparator COM1 becomes 0[V] so that the output of the comparator COM1 becomes a high level, thereby the capacitor C3 being charged.

With the lapse of the initial preset time $t_a$, when the 40[V] power source voltage reaches to 25[V], the reference voltage of the comparator COM2 is escalated so that the output of the comparator COM2 reveals a high level, thereby the capacitor C1 being charged.

The detection voltage of the comparator COM1 escalates in response to the charge of the capacitor C1 so that the output of the comparator COM1 becomes a low level, thereby the capacitor C3 being discharged through the diode D1.

If the excess current flows through the line L3 due to abnormal operations during when the power source is supplied at the external circuit, the potential of the position b becomes higher than that of the position a and the detection voltage of the comparator COM3 becomes lower than the reference voltage so that the output of the comparator COM4 reveals a high level. As a result, the transistor Tr turns on, the light emitting diode 22a flows current therethrough, and the photo transistor 22b turns on so that the procedure for judging abnormal operations is performed to turn off the switching control circuit. On the moment, the capacitor C2 determines whether the preset time $t_s$ is elapsed.

On the other hand, if the power source turns on or off after the procedure for judging abnormal operations, the excess current may flow due to the abnormal operations of the device or the printer so that the 40[V] voltage is, for example, delayed in rising. Then, output inversion time of the comparator COM2 delays as compared to normal rising, which results in the delay of inversion of the comparator COM1 so that the voltage across the capacitor C3 escalates to turn on the transistor Tr causing the suspension of the switching control circuit 15 through the photo coupler 22a.

Figure 5:
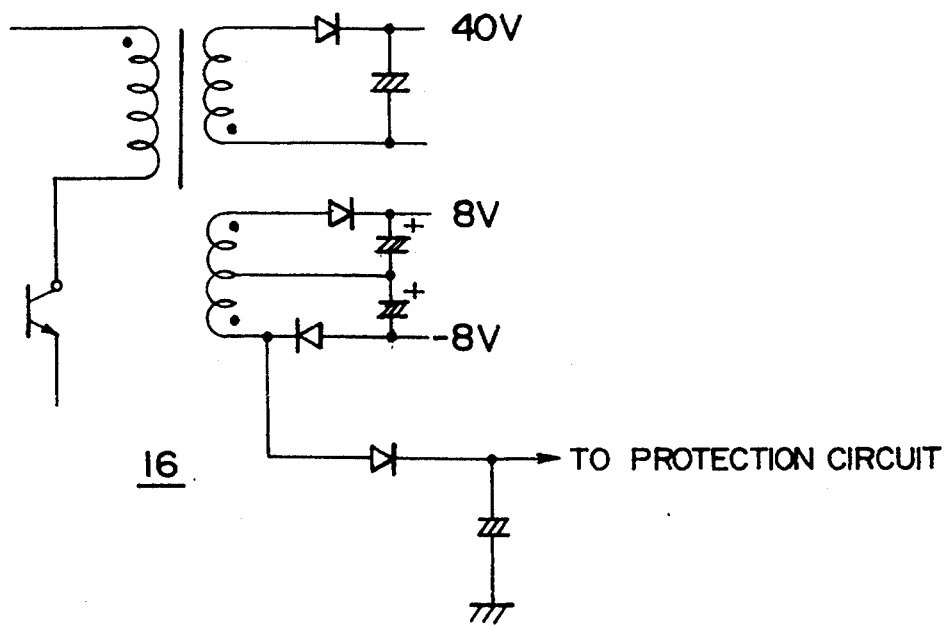
FIG. 5 is a circuit diagram illustrating a wiring example of a high frequency transformer.

In other words, the excess current generated on the 40[V] supply line L1 when the power source switch is turned on can be detected by watching the rising time of the 40[V] voltage with use of the comparators COM1 and 2, the resistor R11, and the capacitor C3. Even though the 40[V] supplying circuit cannot be activated, 8[V] voltage supplying circuit can be easily realized by modifying the wiring diagram of the high frequency transformer, one example of wiring diagram of which is shown in FIG. 5. 8[V] voltage can be obtained from the reverse phase voltage to 40[V] voltage by changing the switching method to RCC. A small size separate transformer can alternatively be utilized, when the procedure for judging whether abnormal operations occur is performed for some reasons, it can be suppressed that the high power source is supplied to the external circuit by detecting whether or not the excess current flows after the lapse of the initial preset time $t_a$.

Now, description will be made as to the second embodiment according to the present invention.

Figure 9:
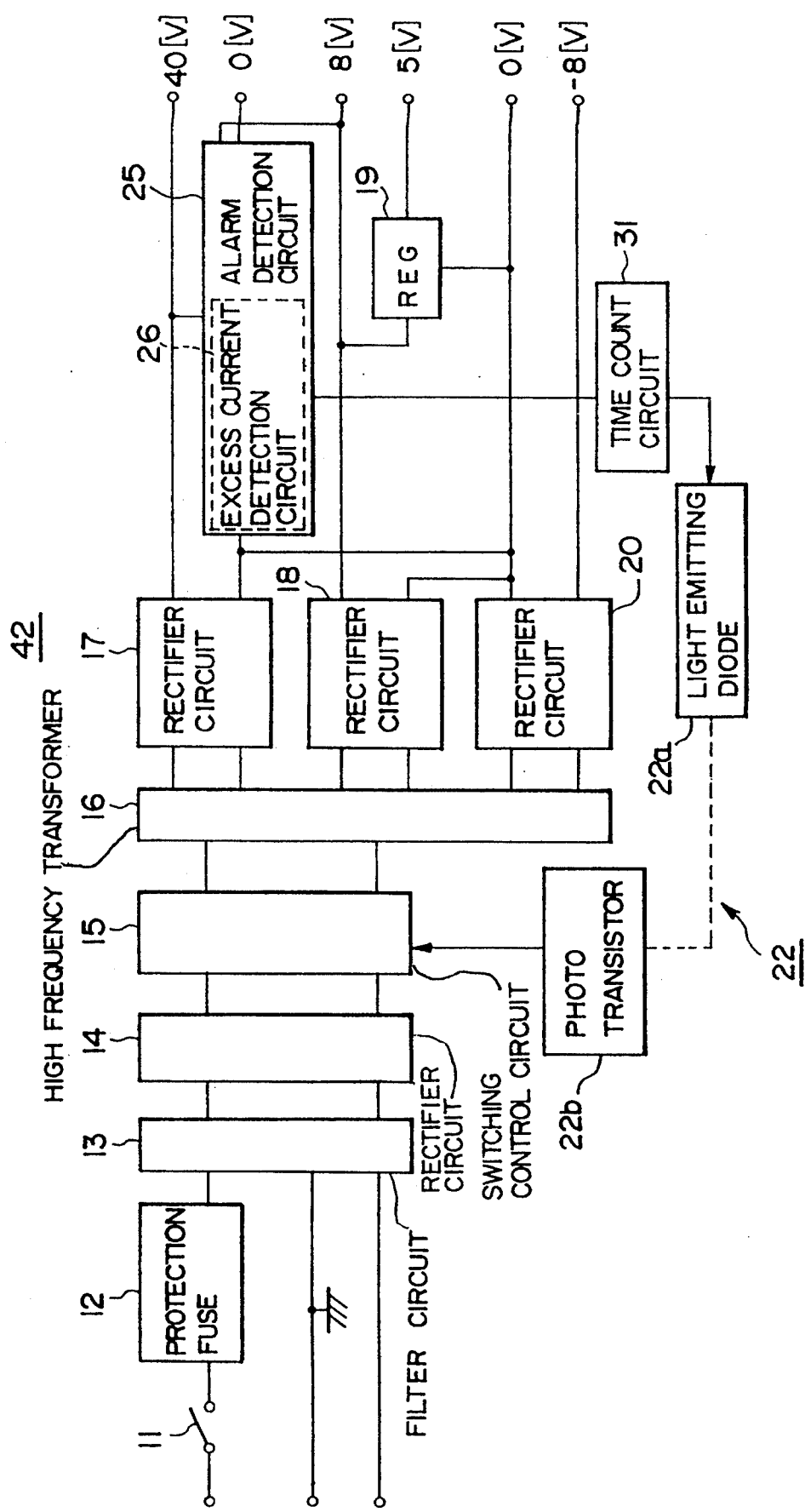
FIG. 9 is a functional block diagram illustrating the second embodiment of the power source circuit according to the present invention.

FIG. 9 is a block diagram of the power source circuit 42 incorporating a protection device therein illustrating the second embodiment according to the present invention, wherein the numeral 11 denotes a power source switch; the numeral 12 a protection fuse; the numeral 13 a filter circuit; the numeral 14 a rectifier circuit; the numeral 15 a switching control circuit; the numeral 16 a high frequency transformer; the numeral 17 a rectifier circuit for outputting 40[V] D.C. voltage; the numeral 18 a rectifier circuit for outputting 8[V] D.C. voltage; the numeral 19 a three terminal regulator for producing 5[V] D.C. voltage from 8[v] D.C. voltage; and the numeral 20 a rectifier circuit for outputting −8[V] D.C. voltage. The D.C. voltages output from the rectifier circuits 17, 18 and 20 are applied, as power source voltages, to unillustrated external circuit connected to the output voltage terminals.

The numeral 22 denotes a photo coupler constituted of a light emitting diode 22a and a photo transistor 22b. The numeral 25 denotes an alarm detection circuit for detecting various kinds of abnormal operations when the printer is activated which detects the excess current or the excess voltage and also detects that the alarm signal is output from the external circuit. The alarm detection circuit 25 in the present embodiment contains the excess current detection circuit 26 which outputs the detection signal when the excess current is detected.

Figure 8:
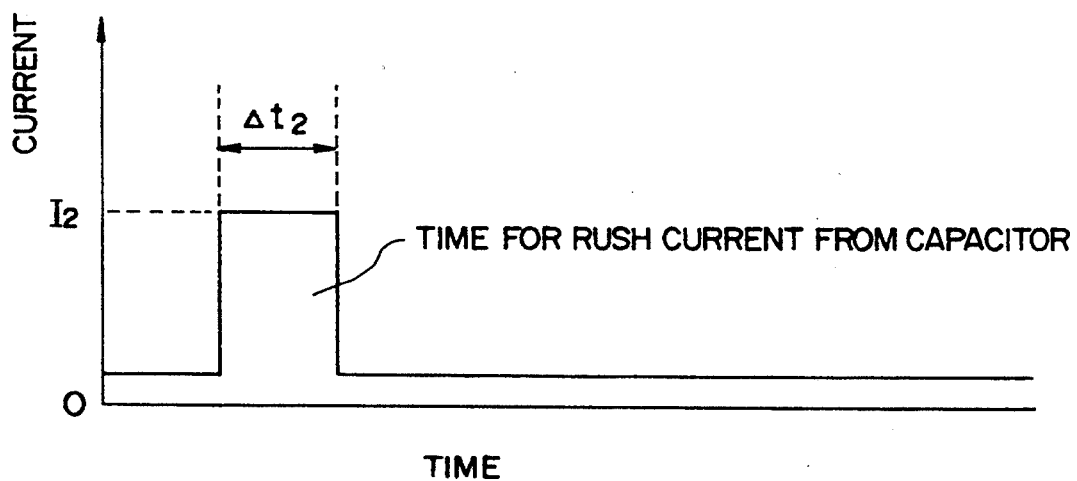

A numeral 31 denotes a time count circuit for shutting down the detection signal until the lapse of the initial preset time ta from turning on the power source switch 11 even though the excess current detection circuit 26 outputs the detection signal. The time count circuit 31 can be constituted of not only digital circuits but also resistors or capacitors. The initial preset time $t_a$ in the present invention is set to be, for example, 200–300[ms] which is longer than the time $\Delta t_2$ but shorter enough than the preset time $t_s$ as shown in FIG. 8.

Next, description will be made as to the protection device of the power source circuit having above mentioned structure.

First, when the power source switch is turned on, an alternate current (A.C.) supplied to the rectifier circuit 14 through the protection fuse 12 and the filter circuit 13 is rectified into a direct current (D.C.) by the rectifier circuit 14 and output to the switching control circuit 15. The switching control circuit 15 contains an unillustrated switching power source circuit which outputs a high frequency current signal to the primary winding of the high frequency transformer 16 by controlling the switching operation of the switching power source circuit.

The high frequency transformer 16 outputs the current signal having a preset voltage corresponding to the voltage and the transformation ratio of the current signal received at the primary winding.

Consecutively, the rectifier circuit 17 rectifies the current output from the secondary winding of the transformer 16 and outputs 40[V] D.C. voltage. The rectifier circuit 18 rectifies the current output from the secondary winding of the transformer 16 and outputs 8[V] D.C. voltage. The three terminal regulator 19 outputs 5[V] D.C. voltage whereas the rectifier circuit 20 rectifies the current signal output from the secondary winding of the transformer 16 and outputs −8[v] D.C. voltage. These D.C. voltages are applied to the external circuit as power source voltages.

If the alarm detection circuit 25 detects the excess current or the excess voltage, or detects that the external circuit outputs the alarm signal, the detection signal is output to the switching control circuit 15 through the photo coupler 22 and the switching power source circuit is turned off to suspend the power source voltage being supplied to the external circuit.

Therefore, when the alarm detection circuit 25 detects, for example, the excess current, the time count circuit 31 measures the time during which the excess current has been detected. If the measured time exceeds the preset time $t_s$, judgement is made as to the external circuit is abnormally operated and the time count circuit 31 turns off the switching control circuit 15.

On this moment, if an user of the printer turns on the power source switch 11 again shortly after turning. off the same, the 40[V] voltage does not rise any more similarly to the first embodiment so that the excess current flows so as to transmit the detection signal to the time count circuit 31, whereby the time count circuit 31 initiates the measurement of time. At this moment, when the excess current detection circuit 26 detects the excess current, the time count circuit 31 suspends the detection signal, although it is output, until the lapse of the initial preset time $t_a$. Then, when the initial preset time $t_a$ is elapsed, the time count circuit 31 outputs the detection signal to the switching control circuit 15 to cause it be turned off. As described above, the time count circuit 31 in the second embodiment performs output control of the detection signal to the switching control circuit 15.

Accordingly, even though the rush current $I_2$ flows at the time when the power source switch 11 is turned on again, the detection signal is suspended until the lapse of the initial preset time $t_a$ and never input to the switching control circuit 15.

Figure 10:
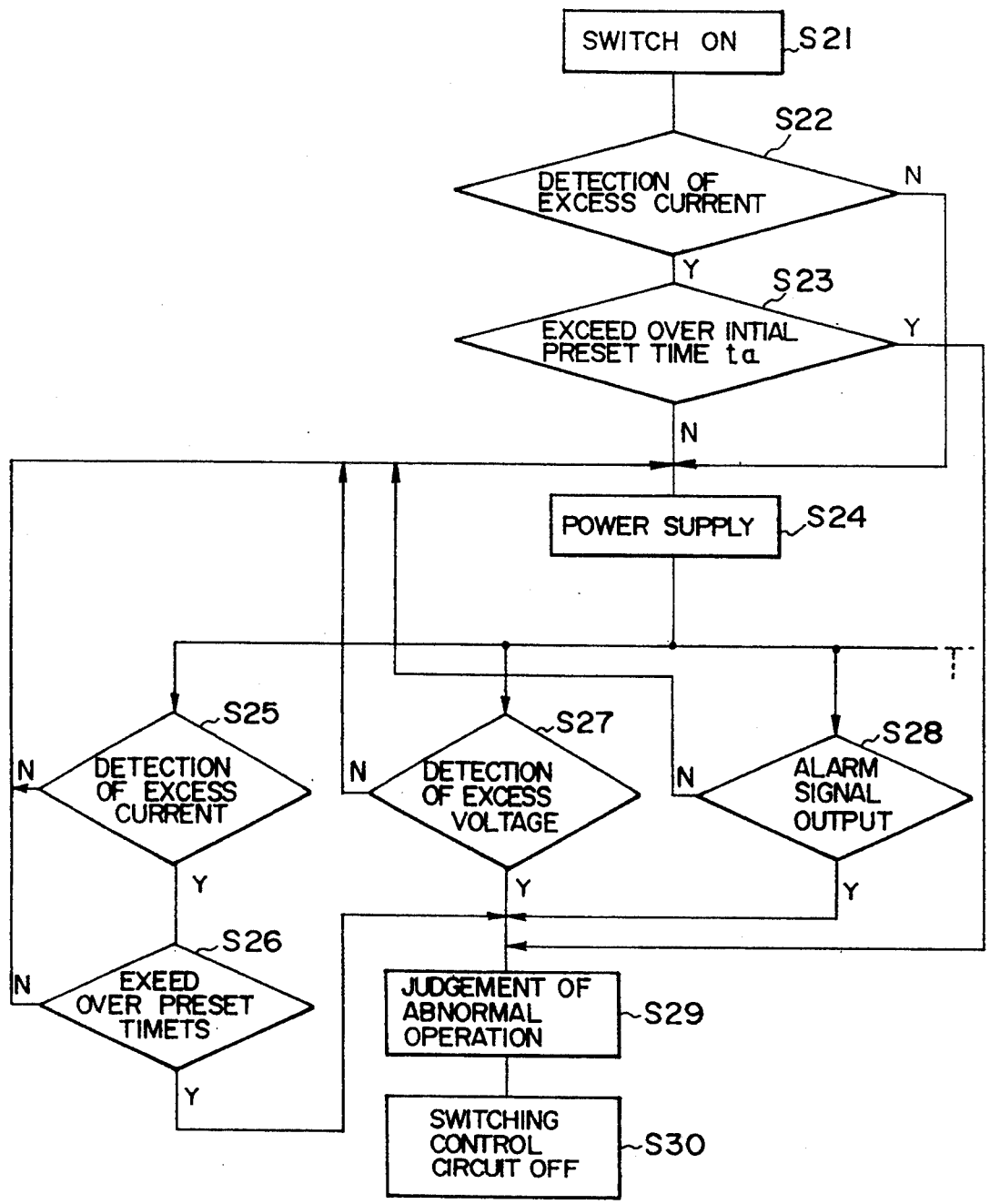
FIG. 10 is a flow chart illustrating operations of the power source circuit shown in FIG. 9.

FIG. 10 is a flow chart illustrating an operation of the second embodiment shown in FIG. 9. Now, referring to FIG. 10, an operation for the alarm detection procedure will be explained in detail hereinafter.

Step S21: Turn on the power source switch 11.

Step S22: Judge whether the excess detection circuit 26 detects the excess current or not.

When detected; go to Step S23; otherwise go to Step S24.

Step S23: Judge whether the time measured by the time count circuit 31 from the power source switch 11 being turned on exceeds the initial preset time $t_a$ or not.

When exceeded; go to Step S29; otherwise go to Step S24.

Step S24: Supply power source to the external circuit.

Step S25: Judge whether the alarm detection circuit 25 detects the excess current or not. When detected; go to Step S26; otherwise return to Step S24.

Step S26: Judge whether or not the time with which the excess current detection circuit 26 detects the excess current exceeds the preset time $t_s$. When exceeded; go to Step S29; otherwise return to Step S24.

Step S27: Judge whether or not the alarm detection circuit 25 detects the excess voltage. When detected; go to Step S29; otherwise return to Step S24.

Step S28: Judge whether or not the alarm signal is output from the external circuit. When output; go to Step S29; otherwise return to Step S24.

Step S29: Judge that the external circuit operates abnormally.

Step S30: Turn off the switching control circuit 15.

As described above, the power source circuit according to the present invention employs a high frequency transformer for transforming a current signal received at its primary winding and outputting a current signal having a preset voltage from its secondary winding, a switching control circuit connected with the primary winding of the high frequency transformer for generating a high frequency current signal, and a rectifier circuit connected with the secondary winding of the high frequency transformer for rectifying the current signal and applying a D.C. voltage to the external circuit.

After detecting the excess current by the excess current detection circuit, the detection signal is output to the switching control circuit when the preset time has elapsed, thereby turning off the switching control circuit. On this moment, the excess current detection circuit delays the detection of the excess current after turning on the power source switch until the lapse of the initial preset time which is shorter than the preset time.

Then, after the switching control circuit is turned off in response to the detection of the excess current, if an user of the device turns on the power source switch again just after turning it off, the excess current detection circuit detects the excess current, with the lapse of the initial preset time which is shorter than the preset time, and outputs the detection signal to the switching control circuit, thereby turning off the switching control circuit. Accordingly, it never happens that damages of the external circuit are magnified.

The power source circuit according to the other aspect of the present invention employs a high frequency transformer for transforming a current signal at its primary winding and outputting a current signal having a preset voltage from its secondary winding, a switching control circuit connected with the primary winding of the high frequency transformer for generating a high frequency current signal, and a rectifier circuit connected with the secondary winding of the high frequency transformer for rectifying the current signal and applying a D.C. voltage to the external circuit.

After detecting the excess current by the excess current detection circuit, the detection signal is output to the switching control circuit when the preset time has elapsed, thereby turning off the switching control circuit. On this moment, the time count circuit suspends the detection signal after turning on the power source switch until the lapse of the initial preset time which is shorter than the preset time.

Then, after the switching control circuit is turned off in response to the detection of the excess current, if an user of the device turns on the power source switch again just after turning it off, the time count circuit outputs the detection signal to the switching control circuit with the lapse of the initial preset time which is shorter than the preset time, thereby turning off the switching control circuit. Accordingly, it never happens that damages of the external circuit are magnified.

While the invention has been particularly shown and described with reference to preferred embodiments thereof, it will be understood by those skilled in the art that the foregoing and other changes in form and details can be made therein without departing from the spirit and scope of the invention.

What is claimed is:

1. A power source circuit incorporating a protection device therein comprising:
   (a) a high frequency transformer having a primary winding and a secondary winding for transforming a first high frequency current at the primary winding and outputting from the secondary winding a second high frequency current signal having a preset voltage;
   (b) a switching control circuit connected with the primary winding for generating the first high frequency current signal from a current signal output by a power source and supplying the first high frequency current signal to the primary winding;
   (c) a rectifier circuit connected with the secondary winding for rectifying the second high frequency current signal into a D.C. current and supplying power to an external circuit;
   (d) an alarm detection circuit for detecting abnormal operations including an excess current in supplying power from the rectifier circuit, turning off an output of the switching control circuit if the excess current continues longer than a predetermined preset time, and suspending the supply of power to the external circuit; and
   (e) an excess current detection circuit for detecting the excess current after turning on a power source switch, turning off the output of the switching control circuit if the excess current is detected after a lapse of an initial preset time which is shorter than the predetermined preset time, and suspending the supply of power to the external circuit.

2. A power source circuit incorporating a protection device therein as set forth in claim 1, wherein the excess current detection circuit includes an excess current detection delay circuit which detects the lapse of the initial preset time.

3. A power source circuit incorporating a protection device therein as set forth in claim 1, wherein the excess current detection circuit detects the excess current generated when a predetermined voltage does not rise, or rises with a delay, due to abnormal operation of the external circuit.

4. A power source circuit incorporating a protection device therein as set forth in claim 1, wherein the excess current detection circuit is constituted of a first comparator, a second comparator, a resistor and a capacitor with which a rising time of the predetermined voltage is watched.

5. A power source circuit incorporating a protection device therein as set forth in claim 1, wherein the predetermined preset time and the initial preset time are set to be approximately four seconds and 200–300 milliseconds (ms), respectively.

6. A power source circuit incorporating a protection device therein comprising:
(a) a high frequency transformer having a primary winding and a secondary winding, for transforming a first high frequency current signal at the primary winding and outputting from the secondary winding a second high frequency current signal having a preset voltage;
(b) a switching control circuit connected with the primary winding for generating the first high frequency current signal from a current signal output by a power source and supplying the first high frequency current signal to the primary winding;
(c) a rectifier circuit connected with the secondary winding for rectifying the second high frequency current signal into a D.C. current and supplying power to an external circuit;
(d) an alarm detection circuit for detecting abnormal operations including an excess current in supplying power from the rectifier circuit;
(e) an excess current detection circuit for detecting the excess current after turning on a power source switch; and
(f) a time count circuit for measuring a first duration of time of a detection signal input from the alarm detection circuit and judging whether the first duration of time exceeds a predetermined preset time or not, and for measuring a second duration of time of a detection signal input from the excess current detection circuit and judging whether the second duration of time exceeds an initial preset time which is shorter than the predetermined preset time or not, so that the switching control circuit is turned off when both judgments are affirmative.

7. A power source circuit incorporating a protection device therein as set forth in claim 6, wherein the excess current detection circuit detects the excess current generated when a predetermined voltage does not rise, or rises with a delay, due to abnormal operation of the external circuit.

8. A power source circuit incorporating a protection device therein as set forth in claim 6, wherein the predetermined time and the initial preset time are set to be approximately four seconds and 200–300 milliseconds (ms), respectively.

9. A printer device having a power source output incorporating a protection device therein, the power source circuit comprising:
(a) a high frequency transformer having a primary winding and a secondary winding for transforming a first high frequency current signal at the primary winding and outputting from the secondary winding a second high frequency current signal having a preset voltage;
(b) a switching control circuit connected with the primary winding for generating the first high frequency current signal from a current signal output by a power source and supplying the first high frequency current signal to the primary winding;
(c) a rectifier circuit connected with the secondary winding for rectifying the second high frequency current signal into a D.C. current and supplying power to an external circuit;
(d) an alarm detection circuit for detecting abnormal operations including an excess current in supplying power from the rectifier circuit, turning off an output of the switching control circuit if the excess current exceeds a predetermined preset time, and suspending the supply of power to the external circuit; and
(e) an excess current detection circuit for detecting the excess current after turning on a power source switch, turning off the output of the switching control circuit if the excess current is detected after a lapse of an initial preset time which is shorter than the predetermined preset time, and suspending the supply of power to the external circuit.

10. A printer device as set forth in claim 9, wherein the printer device is constituted of an impact type printer device.

11. A printer device as set forth in claim 9, wherein the predetermined preset time is set based upon a duration of time during which flows a current necessary to perform one line printing and the initial preset time is set based upon a duration of time during which flows a rush current which occurs when a power source switch of the printer device is turned on.

12. A printer device as set forth in claim 9, wherein the predetermined preset time and the initial preset time are set to be approximately four seconds and 200–300 milliseconds (ms), respectively.

13. A printer device having a power source circuit incorporating a protection device therein, the power source circuit comprising:
(a) a high frequency transformer having a primary winding and a secondary winding for transforming a first high frequency current signal at the primary winding and outputting from the secondary winding a second high frequency current signal having a preset voltage;
(b) a switching control circuit connected with the primary winding for generating the first high frequency current signal from a current signal output by a power source and supplying the first high frequency current signal to the primary winding;
(c) a rectifier circuit connected with the secondary winding for rectifying the second high frequency current signal into a D.C. current and supplying power to an external circuit;
(d) an alarm detection circuit for detecting abnormal operations including an excess current in supplying power from the rectifier circuit;
(e) an excess current detection circuit for detecting the excess current after turning on a power source switch; and
(f) a time count circuit for measuring a first duration of time of a detection signal input from the alarm detection circuit and judging whether the first duration of time exceeds a predetermined preset time or not, and for measuring a second duration of time of a detection signal input from the excess current detection circuit and judging whether the second duration of time exceeds an initial preset time which is shorter than the predetermined preset time or not, so that the switching control circuit is turned off when both judgments are affirmative.

14. A printer device as set forth in claim 13, wherein the printer device is constituted of an impact type printer device.

15. A printer device as set forth in claim 13, wherein he preset time is set based upon a duration of time during which flows a current necessary to perform one line printing and the initial preset time is set based upon a duration of time during which flows a rush current which occurs when a power source switch of the printer device is turned on.

16. A printer device as set forth in claim 13, wherein the predetermined preset time and the initial preset time are set to be approximately four seconds and 200–300 milliseconds (ms), respectively.

* * * * *